US012531018B2

(12) United States Patent
Kim et al.

(10) Patent No.: US 12,531,018 B2
(45) Date of Patent: Jan. 20, 2026

(54) DISPLAY DEVICE AND METHOD OF DRIVING THE SAME

(71) Applicant: SAMSUNG DISPLAY CO., LTD., Yongin-si (KR)

(72) Inventors: Il Nam Kim, Yongin-si (KR); Hyun Dae Lee, Yongin-si (KR); Kang Bin Jo, Yongin-si (KR); Go Eun Cha, Yongin-si (KR); Hee Chul Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/442,823

(22) Filed: Feb. 15, 2024

(65) Prior Publication Data

US 2024/0282256 A1 Aug. 22, 2024

(30) Foreign Application Priority Data

Feb. 21, 2023 (KR) ........................ 10-2023-0023053

(51) Int. Cl.

*G09G 3/3225* (2016.01)
*H10K 59/131* (2023.01)

(52) U.S. Cl.

CPC ......... *G09G 3/3225* (2013.01); *H10K 59/131* (2023.02); *G09G 2300/0819* (2013.01); *G09G 2300/0842* (2013.01); *G09G 2300/0861* (2013.01); *G09G 2360/14* (2013.01)

(58) Field of Classification Search

CPC ............... G09G 3/3225; G09G 3/3233; G09G 2300/0819; G09G 2360/14; G09G 2300/0842; G09G 2300/0861; H10K 59/131

See application file for complete search history.

(56) References Cited

U.S. PATENT DOCUMENTS 9,741,290 B1 * 8/2017 Lee ...................... G09G 3/3233
11,158,258 B2 10/2021 Cha et al.
11,861,934 B2 * 1/2024 Lee .................... G06V 40/1365
(Continued)

FOREIGN PATENT DOCUMENTS

CN 111341808 A 6/2020
KR 10-2021-0064483 A 6/2021
(Continued)

*Primary Examiner* — Doon Y Chow
(74) *Attorney, Agent, or Firm* — F. CHAU & ASSOCIATES, LLC

(57) ABSTRACT

A display device includes a display panel including first and second areas. The display panel includes: pixels located in the first and second areas and connected to scan lines, and including light emitting elements; first light sensors located in the first area and connected to the scan lines, and including first light receiving elements; and second light sensors located in the second area and connected to the scan lines, and including second light receiving elements. The first and second light sensors are connected to a reset line. A reset signal of a first pattern is applied to the reset line in a first mode in which sensing information is generated based on the first light sensors. The reset signal of a second pattern is applied to the reset line in a second mode in which sensing information is generated based on the second light sensors.

20 Claims, 11 Drawing Sheets

(56) References Cited

U.S. PATENT DOCUMENTS

| | | | | |
|---|---|---|---|---|
| 11,862,100 | B2 * | 1/2024 | Jo | G09G 3/3241 |
| 11,955,078 | B2 * | 4/2024 | Song | G09G 3/3233 |
| 12,067,946 | B2 * | 8/2024 | Kim | G09G 3/2092 |
| 12,106,601 | B2 * | 10/2024 | Kim | H10K 39/34 |
| 2022/0075979 | A1 | 3/2022 | Han et al. | |
| 2022/0181406 | A1 | 6/2022 | Seo et al. | |
| 2022/0344405 | A1 | 10/2022 | Zhu et al. | |

FOREIGN PATENT DOCUMENTS

| | | | |
|---|---|---|---|
| KR | 10-2022-0032283 | A | 3/2022 |
| KR | 10-2022-0079732 | A | 6/2022 |

* cited by examiner

<MODE1>

<MODE2>

DISPLAY DEVICE AND METHOD OF DRIVING THE SAME

CROSS-REFERENCE TO RELATED APPLICATION

This U.S. patent application claims priority under 35 U.S.C. § 119 to Korean patent application number 10-2023-0023053 filed on Feb. 21, 2023, the disclosure of which is incorporated by reference in its entirety herein.

1. TECHNICAL FIELD

Embodiments of the present disclosure relate to a display device and a method of driving the display device.

2. DISCUSSION OF RELATED ART

A display device is used as a connection medium between a user and information. Examples of the display device include a liquid crystal display device and an organic light-emitting display device.

The display device may include various sensors such as an illuminance sensor, a light sensor, and a fingerprint sensor. The illuminance sensor is configured to measure the intensity of ambient light. A luminance of an image presented on the display device may be adjusted based on the measured luminance. The light sensor is configured to measure the color density of the ambient light. The color of the image may be corrected using the measured color density. The fingerprint sensor is configured to sense the fingerprint of a user. A user authentication operation may be performed using the sensed fingerprint.

However, when such sensors are designed as independent components, it may be difficult to reduce a size of circuit elements of the display device or increase a size of a display panel of the display device, and complex control signals may also be required.

SUMMARY

At least one embodiment of the present disclosure is directed to a display device and a method of driving the display device, in which an illuminance sensor, a light sensor, and a fingerprint sensor are designed to have substantially the same configuration, and are connected through the same control line.

An embodiment of the present disclosure provides a display device including a reset circuit and a display panel. The reset circuit is configured to apply a reset signal to a reset line. The display panel includes a first area located adjacent to an edge of the display panel, and a second area located adjacent to the first area. The display panel includes: pixels located in the first area and the second area, connected to scan lines, and including light emitting elements; first light sensors located in the first area, connected to the scan lines, and including first light receiving elements; and second light sensors located in the second area, connected to the scan lines, and including second light receiving elements. The first light sensors and the second light sensors are connected to the reset line in common. The reset circuit sets the reset signal to include a first pattern in a first mode in which sensing information is generated based on the first light sensors, and the reset circuit sets the reset signal to include a second in a second mode in which sensing information is generated based on the second light sensors.

A number of pulses included in the first pattern during a specific period may be greater than a number of pulses included in the second pattern during the specific period.

In an embodiment, the first pattern includes a pulse that repeats each frame period, and during the specific period, the second pattern includes a single pulse.

The scan lines may be arranged in a first direction. The first area may extend in the first direction to overlap the scan lines.

The display panel may include a readout line located in the first area. The readout line may be connected to the first light sensors of a first group, a second group, and a third group. The first light receiving elements of the first group may overlap a first color filter of a first color. The first light receiving elements of the second group may overlap a second color filter of a second color. The first light receiving elements of the third group may overlap a third color filter of a third color.

The readout line may be further connected to the first light sensors of a fourth group. The first light receiving elements of the fourth group may not overlap a color filter.

The display device may further include a readout circuit connected with the readout line. The readout circuit may generate the sensing information based on the first light sensors of one group among the first group, the second group, the third group, and the fourth group during one frame period.

The display panel may further include a first readout line, a second readout line, and a third readout line that are located in the first area. The first readout line may be connected to the first light sensors of a first group. The second readout line may be connected to the first light sensors of a second group. The third readout line may be connected to the first light sensors of a third group. The first light receiving elements of the first group may overlap a first color filter of a first color. The first light receiving elements of the second group may overlap a second color filter of a second color. The first light receiving elements of the third group may overlap a third color filter of a third color.

The display panel may further include a fourth readout line located in the first area. The fourth readout line may be connected to the first light sensors of a fourth group. In an embodiment, the first light receiving elements of the fourth group do not overlap a color filter.

The display device may further include a readout circuit connected to the first readout line, the second readout line, the third readout line, and the fourth readout line. The readout circuit may generate the sensing information based on the first light sensors of the first group, the second group, the third group, and the fourth group during one frame period.

An embodiment of the present disclosure provides a method of driving a display device, including: supplying a reset signal in common to both first light sensors located in a first area of a display panel and to second light sensors located in a second area of the display panel; supplying scan signals to the first light sensors, the second light sensors, and pixels located in the first area and the second area; and generating sensing information based on the first light sensors when a current mode is set to a first mode, and otherwise generating sensing information based on the second light sensors when the current mode is set to a second mode. The reset signal include a first pattern in the first mode, and a second pattern in the second mode. The first light sensors include first light receiving elements and the second light sensors include second light sensors.

A number of pulses included in the first pattern during a specific period may be greater than a number of pulses included in the second pattern during the specific period.

The first pattern may include a pulse that repeats each frame period and during the specific period, the second pattern may include a single pulse.

The display panel may include scan lines. The scan lines may be arranged in a first direction. The first area may extend in the first direction to overlap the scan lines.

The display panel may further include a readout line located in the first area. The readout line may be connected to the first light sensors of a first group, a second group, and a third group. The first light receiving elements of the first group may overlap a first color filter of a first color. The first light receiving elements of the second group may overlap a second color filter of a second color. The first light receiving elements of the third group may overlap a third color filter of a third color.

The readout line may be further connected to the first light sensors of a fourth group. The first light receiving elements of the fourth group may not overlap a color filter.

The display device may further include a readout circuit connected with the readout line. The readout circuit may generate the sensing information based on the first light sensors of one group among the first group, the second group, the third group, and the fourth group during one frame period.

The display panel may further include a first readout line, a second readout line, and a third readout line that are located in the first area. The first readout line may be connected to the first light sensors of a first group. The second readout line may be connected to the first light sensors of a second group. The third readout line may be connected to the first light sensors of a third group. The first light receiving elements of the first group may overlap a first color filter of a first color. The first light receiving elements of the second group may overlap a second color filter of a second color. The first light receiving elements of the third group may overlap a third color filter of a third color.

The display panel may further include a fourth readout line located in the first area. The fourth readout line may be connected to the first light sensors of a fourth group. In an embodiment, the first light receiving elements of the fourth group do not overlap a color filter.

The display device may further include a readout circuit connected to the first readout line, the second readout line, the third readout line, and the fourth readout line. The readout circuit may generate the sensing information based on the first light sensors of the first group, the second group, the third group, and the fourth group during one frame period.

DETAILED DESCRIPTION

Figure 1:
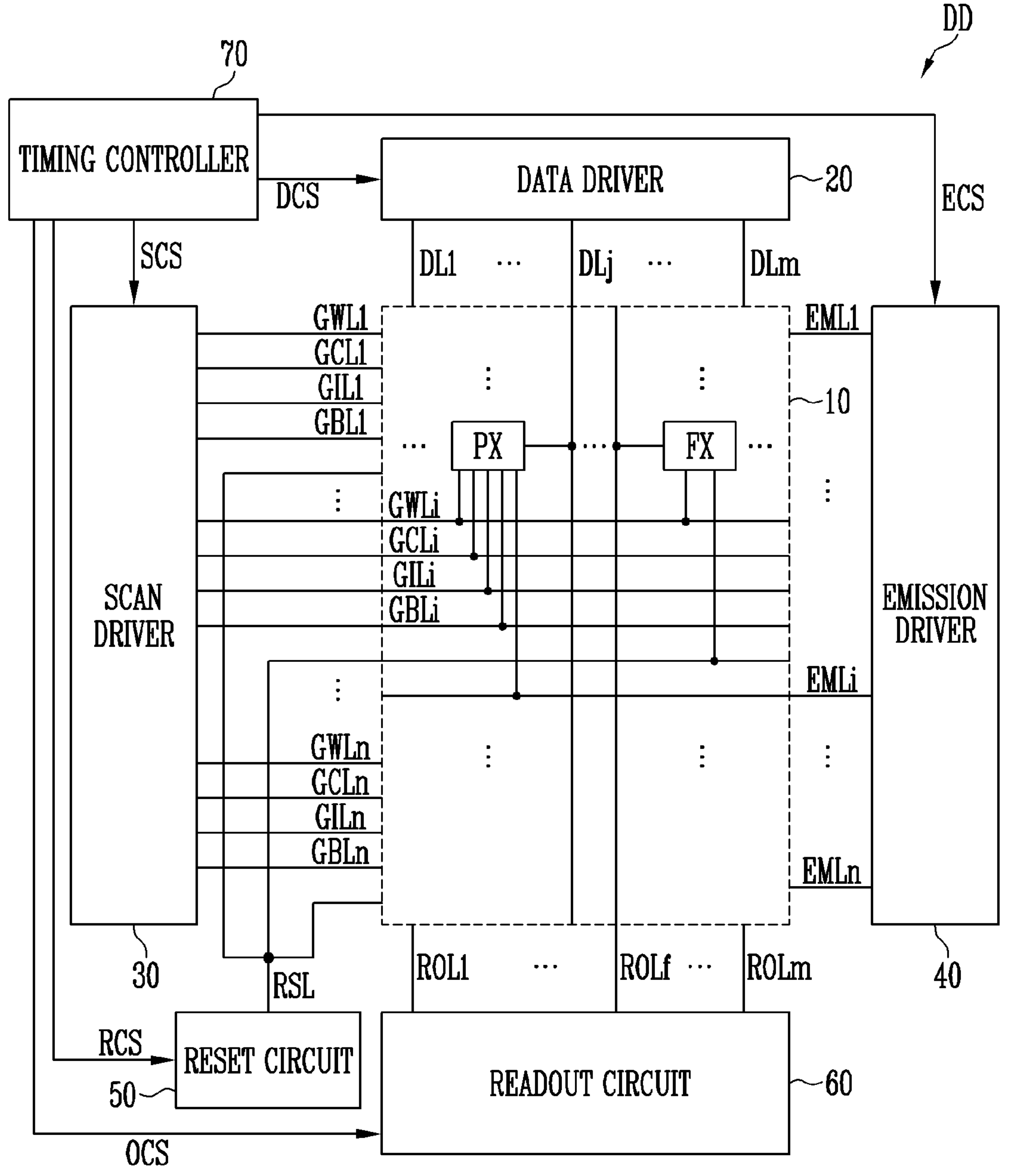
FIG. 1 is a diagram for describing a display device in accordance with an embodiment of the present disclosure.

Hereinafter, embodiments of the present invention will be described in detail with reference to the attached drawings, such that those skilled in the art can implement the present invention. The present disclosure may be implemented in various forms, and is not limited to the embodiments to be described herein below.

In the drawings, portions which are not related to the present disclosure will be omitted in order to explain the present disclosure more clearly. Reference should be made to the drawings, in which similar reference numerals are used throughout the different drawings to designate similar components. Therefore, the aforementioned reference numerals may be used in other drawings.

For reference, the size of each component and the thicknesses of lines illustrating the component are represented for the sake of explanation, and the present disclosure is not limited to what is illustrated in the drawings. In the drawings, the thicknesses of the components may be exaggerated to clearly depict multiple layers and areas.

Furthermore, the expression "being the same" may mean "being substantially the same". In other words, the expression "being the same" may include a range that can be tolerated by those skilled in the art. The other expressions may also be expressions from which "substantially" has been omitted.

FIG. 1 is a diagram for describing a display device DD in accordance with an embodiment of the present disclosure.

Referring to FIG. 1, the display device DD in accordance with an embodiment of the present disclosure includes a display panel 10, a data driver 20 (e.g., a first driver circuit), a scan driver 30 (e.g., a second driver circuit), an emission driver 40 (e.g., a third driver circuit), a reset circuit 50, a readout circuit 60, and a timing controller 70 (e.g., a control circuit).

The display device DD may be driven in a first mode or a second mode. The first mode may be a mode in which an illuminance sensing operation and an light sensing operation are performed. The light sensing operation may be referred to as a red-green-blue (RGB) light sensing operation when used to sense RGB light. The illuminance sensing operation may include measuring the intensity of ambient light. A luminance of an image may be controlled or adjusted using the measured intensity. The RGB light sensing operation may include measuring the color density of the ambient light. The color of the image may be corrected using the measured color density. The second mode may be a mode in which a fingerprint sensing operation is performed. The fingerprint sensing operation may include sensing the fingerprint of a user to enable user authentication to be performed.

For example, the display device DD may be generally driven in the first mode. Therefore, in the case where a use environment of the user is changed (e.g., in the case where the display device DD moves from an indoor area to an outdoor area and ambient light is thus changed), the luminance and the color of the image may be automatically adjusted. The display device DD may be switched from the first mode to the second mode in the case where a specific application program requiring user authentication is executed.

The timing controller 70 may receive grayscale signals (e.g., image signals) and timing signals for each frame period from a processor. Here, the processor may correspond to at least one of a graphics processing unit (GPU), a central processing unit (CPU), an application processor (AP), and the like. The timing signals may include a vertical synchronization signal, a horizontal synchronization signal, a data enable signal, and the like.

Each cycle of the vertical synchronization signal may correspond to each frame period. Each cycle of the horizontal synchronization signal may correspond to each horizontal period. For example, all pixel rows of the display panel 10 may receive image data during the frame period and one of the pixels rows may receive image data during the horizontal period. The grayscale signals may be supplied on a horizontal line basis in response to a pulse of an enable level of a data enable signal during each horizontal period. The horizontal line may refer to pixels (e.g., a pixel line or row) connected to the same scan line and the same emission line.

The timing controller 70 may generate a first control signal SCS, a second control signal ECS, a third control signal DCS, a fourth control signal RCS, and a fifth control signal OCS, based on the received grayscale signals and the received timing signals. The first control signal SCS may be supplied to the scan driver 30. The second control signal ECS may be supplied to the emission driver 40. The third control signal DCS may be supplied to the data driver 20. The fourth control signal RCS may be supplied to the reset circuit 50. The fifth control signal OCS may be supplied to the readout circuit 60. The timing controller 70 may re-order (e.g., render) and correct the grayscale signals and supply the re-ordered and corrected grayscale signals to the data driver 20. The timing controller 70 may detect the intensity and the color density of ambient light, the fingerprint of the user, and the like, based on sensing information received from the readout circuit 60.

The display panel 10 may include pixels PX connected to data lines DL1, . . . , DLj, . . . , and DLm, scan lines GWL1, . . . , GWLi, . . . , GWLn, GCL1, . . . , GCLi, . . . , GCLn, GIL1, . . . , GILi, . . . , GILn, GBL1, . . . , GBLi, . . . , and GBLn, and emission lines EML1, . . . , EMLi, . . . , and EMLn. Further, the display panel 10 may include light sensors FX connected to the first scan lines GWL1, . . . , GWLi, . . . , and GWLn, a reset line RSL, and readout lines ROL1, . . . , ROLf, . . . , and ROLm. Here, m and n each are an integer greater than 1. The pixels PX may include light emitting elements. For example, the light emitting elements may be light-emitting-diodes (LEDs). The light sensors FX may include light receiving elements. For example, the light receiving elements may include photodiodes.

The data driver 20 may receive the grayscale signals and the third data control signal DCS from the timing controller 70. For example, the third control signal DCS may include a source start signal, a clock signal, and the like. For example, the data driver 20 may shift the source start signal based on the clock signal and sample the grayscale signals, and may apply data voltages corresponding to the sampled grayscale signals to the data lines DL1 to DLm on a pixel row basis.

The scan driver 30 may receive the first control signal SCS from the timing controller 70. The first control signal SCS may include a clock signal, a scan start signal, and the like. The scan driver 30 may supply scan signals to the scan lines GWL1, . . . , GWLi, . . . , GWLn, GCL1, . . . , GCLi, . . . , GCLn, GIL1, . . . , GILi, . . . , GILn, GBL1, . . . , GBLi, . . . , and GBLn, in response to the first control signal SCS.

Although FIG. 1 illustrates an embodiment having a configuration in which the scan lines GWL1, . . . , GWLi, . . . , GWLn, GCL1, . . . , GCLi, . . . , GCLn, GIL1, . . . , GILi, . . . , GILn, GBL1, . . . , GBLi, . . . , and GBLn are connected to the single scan driver 30, the present disclosure is not limited thereto. For example, the scan driver 30 may include a first sub-scan driver connected to the first scan lines GWL1, . . . , GWLi, . . . , and GWLn, a second sub-scan driver connected to the second scan lines GCL1, . . . , GCLi, . . . , and GCLn, a third sub-scan driver connected to the third scan lines GILL, . . . , GILi, . . . , and GILn, and a fourth sub-scan driver connected to the fourth scan lines GBL1, . . . , GBLi, . . . , and GBLn. In another example, the scan driver 30 may be configured to include a first sub-scan driver connected to the scan lines GWL1, . . . , GWLi, . . . , GWLn, GBL1, . . . , GBLi, . . . , and GBLn, and a second sub-scan driver connected to the scan lines GCL1, . . . , GCLi, . . . , GCLn, GIL1, . . . , GILi, . . . , and GILn.

The scan driver 30 or each sub-scan driver may sequentially supply scan signals each having a turn-on level pulse to the corresponding scan lines. The scan driver 30 or each sub-scan driver may include scan stages configured in the form of a shift register. The scan driver 30 or each sub-scan driver may generate scan signals in such a way as to sequentially transmit a scan start signal in the form of a pulse of a turn-on level to a subsequent scan stage under the control of a clock signal.

The emission driver 40 may receive the second control signal ECS from the timing controller 70. The second control signal ECS may include a clock signal, an emission stop signal, and the like. The emission driver 40 may supply emission signals to the emission lines ELM1 to EMLn in response to the second control signal ECS.

The emission driver 40 may sequentially supply emission signals each having a pulse of a turn-on level to the emission lines ELM1 to EMLn. The emission driver 40 may include emission stages configured in the form of shift registers. The emission driver 40 may generate emission signals in such a way as to sequentially transmit an emission stop signal in the form of a pulse of a turn-off level to a subsequent emission stage under the control of a clock signal.

Although FIG. 1 illustrates an embodiment in which the scan driver 30 and the emission driver 40 are provided as separate components, the present disclosure is not limited thereto. For example, the scan driver 30 and the emission driver 40 may be integrated into a single driving circuit, a single module, or the like.

The reset circuit 50 may receive the fourth control signal RCS from the timing controller 70. The reset circuit 50 may apply a reset signal to the reset line RSL in response to the fourth control signal RCS. In an embodiment, the reset circuit 50 applies a reset signal of a first pattern to the reset line RSL when the fourth control signal RCS indicates the first mode. In an embodiment, the reset circuit 50 applies a reset signal of a second pattern to the reset line RSL when the fourth control signal RCS indicates the second mode.

The reset line RSL may be connected in common to all of the light sensors FX of the display panel 10.

The readout circuit 60 may receive the fifth control signal OCS from the timing controller 70. The readout circuit 60 may provide, to the timing controller 70, sensing information based on sensing signals received from the readout lines ROL1 to ROLm in response to the fifth control signal OCS.

Figure 2:
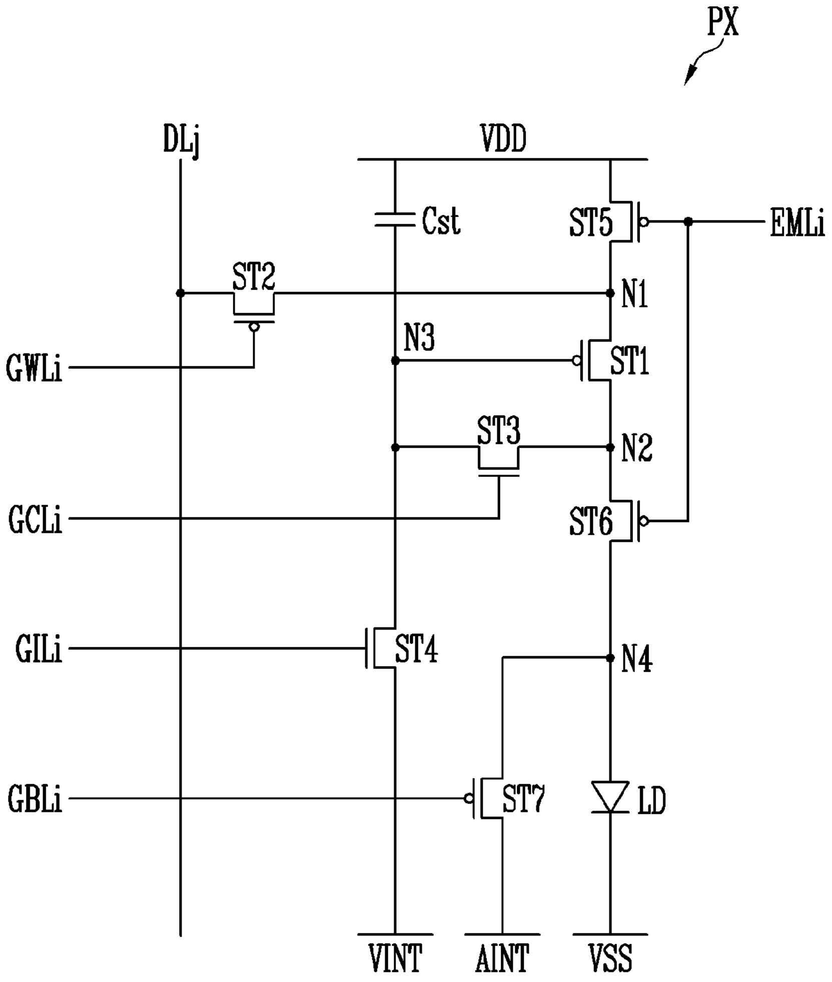
FIG. 2 is a diagram for describing a pixel in accordance with an embodiment of the present disclosure.

FIG. 2 is a diagram for describing a pixel PX in accordance with an embodiment of the present disclosure.

FIG. 2 illustrates a pixel PX disposed on an i-th pixel row and a j-th pixel column among a plurality of pixels PX. A pixel row may refer to pixels connected to the same scan lines and the same emission line. A pixel column may refer to pixels connected to the same data line. Here, i is an integer of 1 or more and n or less, and j is an integer of 1 or more and m or less.

Referring to FIG. 2, the pixel PX may include pixel transistors ST1 to ST7, a light emitting element LD, and a storage capacitor Cst, but is not limited thereto.

The first pixel transistor ST1 (a driving transistor) may include a first electrode connected to a first node N1, a second electrode connected to a second node N2, and a gate electrode connected to a third node N3. The first pixel transistor ST1 may control, in response to a voltage of the third node N3, driving current flowing from a first power supply VDD (or a first power voltage) to a second power supply VSS (or a second power voltage) via the light emitting element LD. In an embodiment, a voltage of the first power supply VDD is higher than a voltage of the second power supply VSS.

The second pixel transistor ST2 (a switching transistor) may include a first electrode connected to a data line DLj, a second electrode connected to the first node N1, and a gate electrode connected to the first scan line GWLi. When a first scan signal of a turn-on level is supplied to the first scan line GWLi, the second pixel transistor ST2 may be turned on so that the data line DLj and the first electrode of the first pixel transistor ST1 can be electrically connected to each other.

The third pixel transistor ST3 (a diode-connected transistor) may include a first electrode connected to the second node N2, a second electrode connected to the third node N3, and a gate electrode connected to the second scan line GCLi. When a second scan signal of a turn-on level is supplied to the second scan line GCLi, the third pixel transistor ST3 may be turned on so that the second electrode of the first pixel transistor ST1 and the third node N3 can be electrically connected to each other. In other words, when the third pixel transistor ST3 is turned on, the first pixel transistor ST1 may be connected in the form of a diode.

The fourth pixel transistor ST4 (a gate initialization transistor) may include a first electrode connected to the third node N3, a second electrode connected to a first initialization voltage line to which a first initialization voltage VINT is to be applied, and a gate electrode connected to the third scan line GILi. When a third scan signal GI[i] of a turn-on level is supplied to the third scan line GILi, the fourth pixel transistor ST4 may be turned on so that the first initialization voltage VINT can be applied to the third node N3.

The fifth pixel transistor ST5 (a first emission transistor) may include a first electrode connected to a first power line to which the first power voltage VDD is to be applied, a second electrode connected to the first node N1, and a gate electrode connected to the emission line EMLi. The fifth pixel transistor ST5 may be turned off when an emission signal of a turn-off level is supplied to the emission line EMLi, and may be turned on when the reset signal is being applied.

The sixth pixel transistor ST6 (a second emission transistor) may include a first electrode connected to the second node N2, a second electrode connected to a fourth node N4, and a gate electrode connected to the emission line EMLi. The sixth pixel transistor ST6 may be turned off when an emission signal of a turn-off level is supplied to the emission line EMLi, and may be turned on when the reset signal is applied.

The seventh pixel transistor ST7 (an anode initialization transistor) may include a first electrode connected to the fourth node N4, a second electrode connected to a second initialization voltage line to which a second initialization voltage AINT is to be applied, and a gate electrode connected to the fourth scan line GBLi. When a fourth scan signal of a turn-on level is supplied to the fourth scan line GBLi, the seventh pixel transistor ST7 may be turned on so that the second initialization voltage AINT can be applied to the fourth node N4.

Each of some transistors ST1, ST2, ST5, ST6, and ST7 among the pixel transistors ST1 to ST7 may be a P-type transistor, and each of the other transistors ST3 and ST4 may be an N-type transistor, but is not limited to thereto. For example, each of the pixel transistors ST1 to ST7 may be a P-type transistor or an N-type transistor.

The storage capacitor Cst may include a first electrode connected to the first power line to which the first power voltage VDD is to be applied, and a second electrode connected to the third node N3.

The light emitting diode LD may include an anode connected to the fourth node N4, and a cathode connected to the second power line to which the second power voltage VSS is to be applied. The light emitting element LD may be a light emitting diode. The light emitting element LD may be formed of an organic light emitting diode, an inorganic light emitting diode, a quantum dot/well light emitting diode, or the like. The light emitting element LD may emit light having any one of a first color, a second color, and a third color. Although in the present embodiment only one light emitting element LD is provided in each pixel, a plurality of light emitting elements may be provided in each pixel in another embodiment. Here, the plurality of light emitting elements may be connected in series, parallel, or series-parallel to each other.

Figure 3:
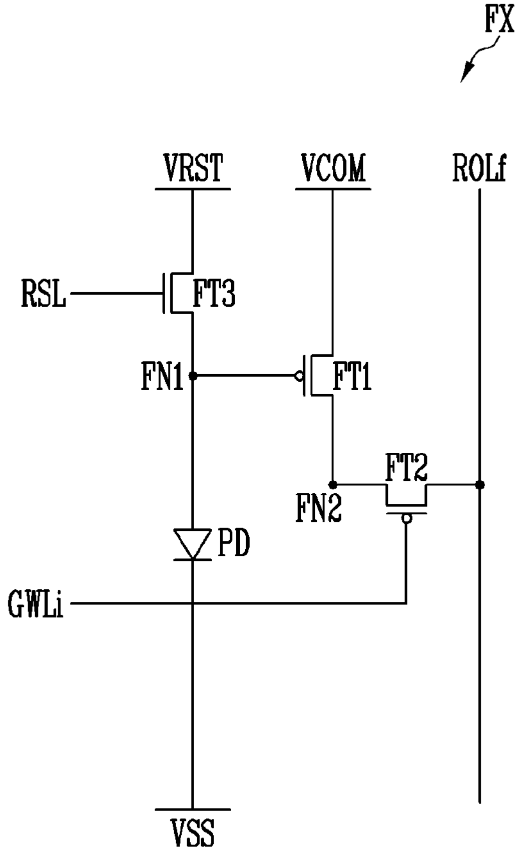
FIG. 3 is a diagram illustrating a light sensor in accordance with an embodiment of the present disclosure.

FIG. 3 is a diagram illustrating a light sensor FX in accordance with an embodiment of the present disclosure.

Referring to FIG. 3, the light sensor FX may include sensing transistors FT1 to FT3 and a light receiving element PD, but is not limited thereto.

The first sensing transistor FT1 (an amplifying transistor) may include a first electrode connected to a common voltage line to which a common voltage VCOM is to be applied, a second electrode connected to the second node FN2, and a gate electrode connected to a first node FN1. The first sensing transistor FT1 may control sensing current flowing through the first sensing transistor FT1, in response to a voltage of the first node FN1. The sensing current may be supplied, as a sensing signal, to a readout line ROLf via the second sensing transistor FT2.

The second sensing transistor FT2 (an output transistor) may include a first electrode connected to a second node FN2, a second electrode connected to the readout line ROLf, and a gate electrode connected to the first scan line GWLi. In an embodiment, the gate electrode of the second sensing transistor FT2 and the gate electrode of the second pixel transistor ST2 are connected to the same scan line, i.e., the first scan line GWLi. When a first scan signal of a turn-on level is supplied to the first scan line GWLi, the second sensing transistor FT2 may be turned on so that the second electrode of the first sensing transistor FT1 and the readout line ROLf can be electrically connected to each other.

The third sensing transistor FT3 (a reset transistor) may include a first electrode connected to a reset voltage line to which a reset voltage VRST is to be applied, a second electrode connected to the first node FN1, and a gate electrode connected to the reset line RSL. When a reset signal of a turn-on level is supplied to the reset line RSL, the third sensing transistor FT3 may be turned on so that the reset voltage VRST can be supplied to the first node FN1. The first node FN1, i.e., the gate electrode of the first sensing transistor FT1, may be reset by the reset voltage VRST. In an embodiment, the reset voltage VRST is set to be less than the second power voltage VSS.

Each of some transistors FT1 and FT2 among the sensing transistors FT1 to FT3 may be a P-type transistor, and the other transistor FT3 may be an N-type transistor, but not limited to thereto. For example, each of the sensing transistors FT1 to FT3 may be a P-type transistor or an N-type transistor.

The light receiving element PD may include a first electrode (or an anode) connected to the first node FN1, and a second electrode (or a cathode) connected to the second power line to which the second power voltage VSS is to be applied. The light receiving element PD may be a photo diode. However, in an embodiment, the light receiving element PD may be formed of a photo transistor. In the light receiving element PD, when light is received, electrons are excited, and reverse current is allowed to flow in a direction from the cathode to the anode. Therefore, if the light receiving element PD is exposed to light, the voltage of the first node FN1 may gradually increase after a reset time point. As a light receiving time or light intensity increases, an increment in voltage of the first node FN1 after the reset time point may increase. Therefore, the magnitude of sensing current flowing through the readout line ROLf may vary depending on the light receiving time and the light intensity.

The light sensor FX in accordance with an embodiment may be used as an illuminance sensor, an RGB light sensor, a fingerprint sensor, or the like.

Figure 4:
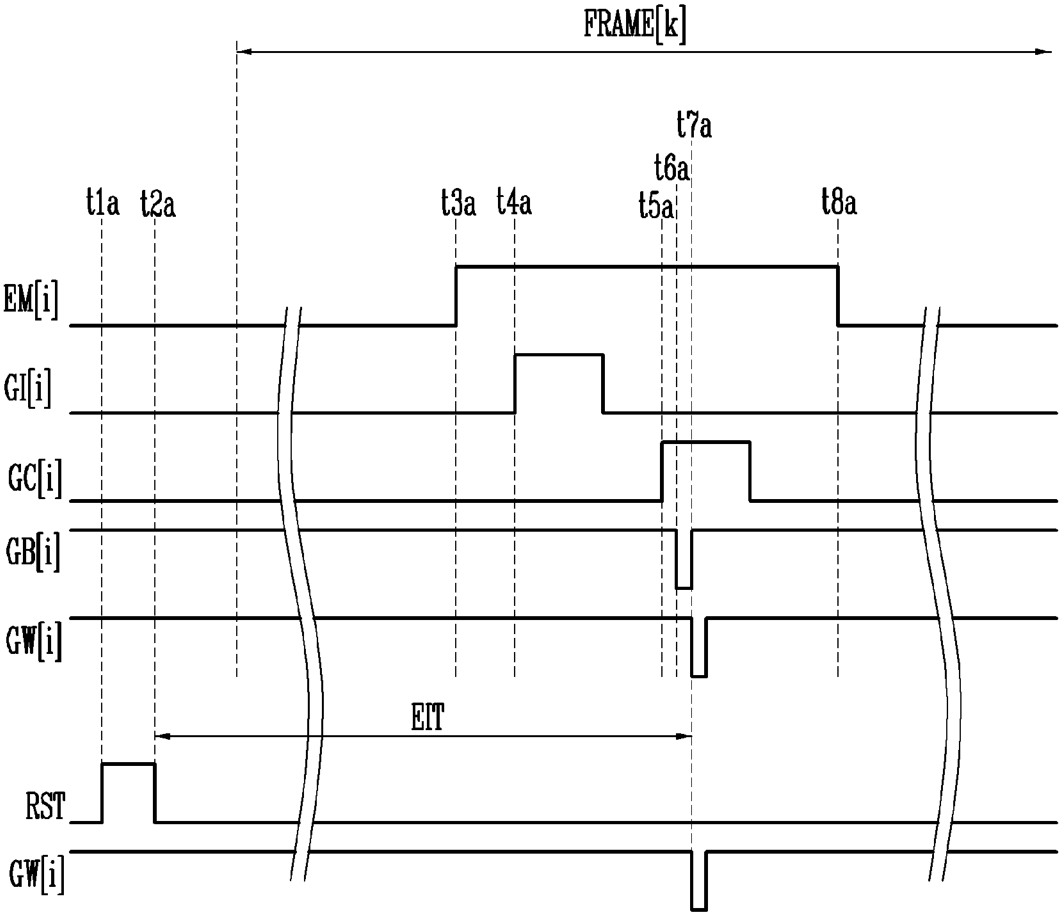
FIG. 4 is a diagram for describing a method of driving the pixel and the light sensor in accordance with an embodiment of the present disclosure.

FIG. 4 is a diagram for describing a method of driving the pixel and the light sensor in accordance with an embodiment of the present disclosure.

FIG. 4 illustrates a process during which the pixel PX of FIG. 2 and the light sensor FX of FIG. 3 are operated in a k-th frame period FRAME[k].

First, during a period from t1*a* to t2*a* before the k-th frame period FRAME[k], a reset signal RST of a turn-on level is applied to the reset line RSL. Therefore, the first node FN1 of the light sensor FX may be reset by a reset voltage VRST. After the time point t2*a*, the voltage of the first node FN1 gradually increases depending on the length of a light receiving period EIT and the light intensity.

At a time point t3*a*, an emission signal EM[i] of a turn-off level is supplied to the emission line EMLi. Hence, the fifth pixel transistor ST5 and the sixth pixel transistor ST6 are turned off, so that the light emitting element LD can be prevented from emitting light.

At a time point t4*a*, a third scan signal GI[i] of a turn-on level is supplied to the third scan line GILi. Hence, the fourth pixel transistor ST4 is turned on, and the third node N3 is initialized to the first initialization voltage VINT.

At a time point t5*a*, a second scan signal GC[i] of a turn-on level is supplied to the second scan line GCLi. Hence, the third pixel transistor ST3 is turned on, and the first pixel transistor ST1 enters a diode-connected state.

At a time point t6*a*, a fourth scan signal GB[i] of a turn-on level is supplied to the fourth scan line GBLi. Hence, the seventh pixel transistor ST7 is turned on, and the fourth node N4 is initialized to the second initialization voltage AINT. In an embodiment, the second initialization voltage AINT is set to be the same as or less than the second power voltage VSS. This may be advantageous in terms of low grayscale expression of the light emitting element LD.

At a time point t7*a*, a first scan signal GW[i] of a turn-on level is supplied to the first scan line GWLi. Hence, the second pixel transistor ST2 is turned on, and a data voltage is applied to the first node N1. Here, the third node N3 is in a state of having been supplied with the first initialization voltage VINT. In an embodiment, the first initialization voltage VINT is a voltage sufficiently less than data voltages applied to the data lines. Therefore, the first pixel transistor ST1 may be turned on, so that a compensation data voltage obtained by reflecting a threshold voltage decrement in the data voltage may be applied to the third node N3. The storage capacitor Cst may maintain a voltage corresponding to a difference between the first power voltage VDD and the compensation data voltage. This period may be referred to as a threshold voltage compensation period or a data write period.

Furthermore, at a time point t7*a*, the second sensing transistor FT2 is turned on by the first scan signal GW[i] of a turn-on level. Hence, sensing current corresponding to the light receiving period EIT and the light intensity may flow through the readout line ROLf.

At a time point t8*a*, the emission signal EM[i] of a turn-on level is supplied to the emission line EMLi. Hence, the fifth pixel transistor ST5 and the sixth pixel transistor ST6 are turned on, so that the light emitting element LD enters an emission-enable state.

Here, a driving current path that connects the first power line (e.g., receiving VDD), the fifth pixel transistor ST5, the first pixel transistor ST1, the sixth pixel transistor ST6, the light emitting element LD, and the second power line (e.g., receiving VSS) may be formed. The amount of driving current that flows through the first electrode and the second electrode of the first pixel transistor ST1 may be adjusted in response to the voltage maintained in the storage capacitor Cst. The light emitting element LD may emit light at a luminance corresponding to the amount of driving current. The light emitting element LD may emit light until the emission signal EM[i] of a turn-off level is applied to the emission line EMLi.

Figure 5:
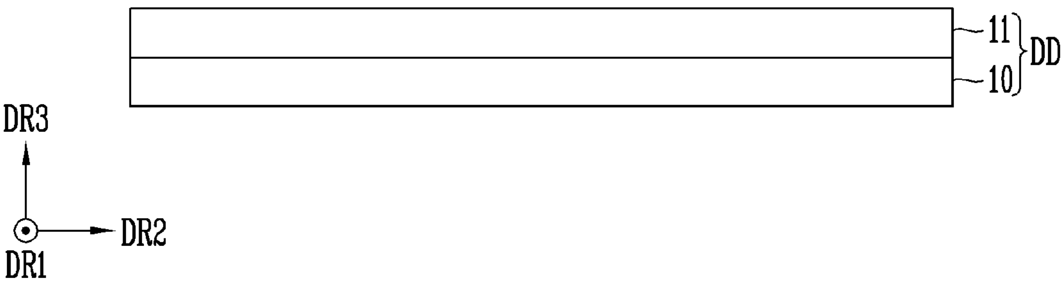
FIG. 5 is a diagram for describing a stacking relationship of a display panel and a touch sensor.

FIG. 5 is a diagram for describing a stacking relationship of a display panel 10 and a touch sensor 11 (e.g., a touch sensor device).

Referring to FIG. 5, the display device DD may include the display panel 10 and the touch sensor 11. The display panel 10 may be a plate-type display panel extending in a first direction DR1 and a second direction DR2. The first direction DR1 and the second direction DR2 may be perpendicular to each other. Likewise, the touch sensor 11 may be a plate-type touch sensor extending in the first direction DR1 and the second direction DR2.

The touch sensor 11 may be disposed in a third direction DR3 of the display panel 10. The third direction DR3 may be perpendicular to the first direction DR1 and the second direction DR2. The third direction DR3 may be an image display direction of the display panel 10. The user may view an image in the third direction DR3 of the display panel 10 and touch the touch sensor 11, so that the user can intuitively control the display device DD. The touch sensor 11 may be implemented as a mutual-capacitance touch sensor, or a self-capacitance touch sensor.

Figure 6:
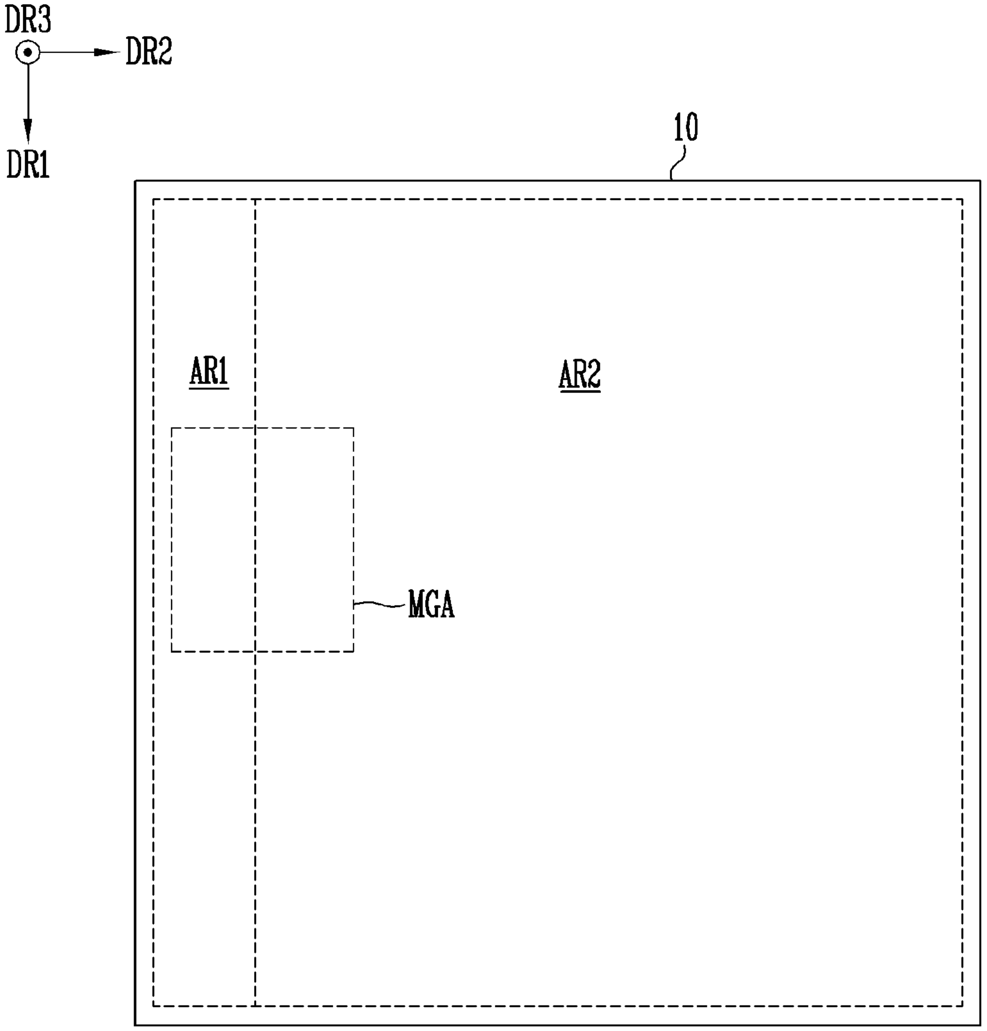
FIGS. 6 and 7 are diagrams for described a display panel in accordance with an embodiment of the present disclosure.
Figure 7:
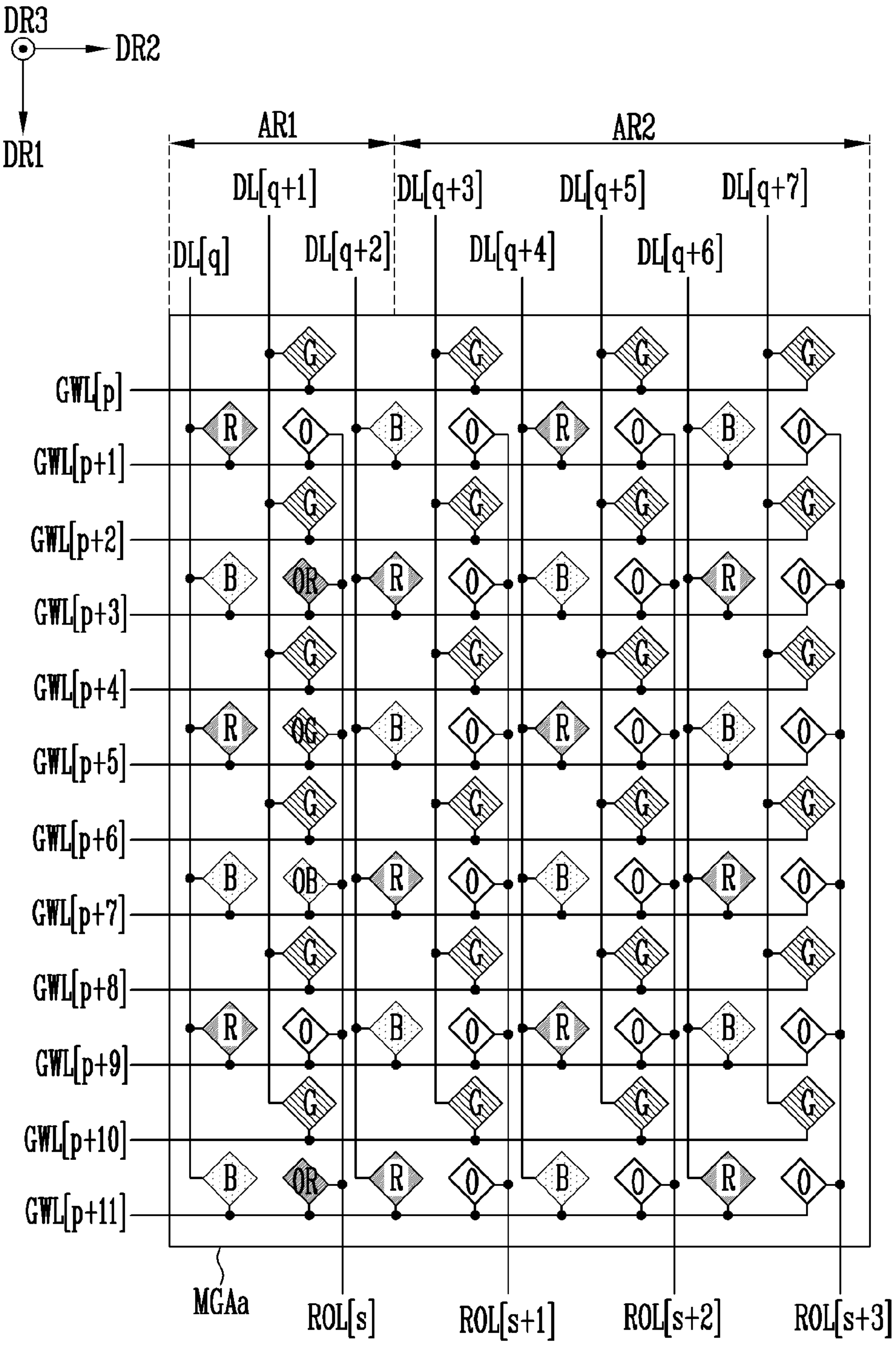

FIGS. 6 and 7 are diagrams for describing a display panel 10 in accordance with an embodiment of the present disclosure.

Referring to FIG. 6, the display panel 10 includes a first area AR1 and a second area AR2.

The first area AR1 may be an area adjacent to an edge of the display panel 10. The first area AR1 may be an area for illuminance sensing and RGB light sensing. In the illuminance sensing and the RGB light sensing, external light is required to be sensed, so that the external light should be prevented from being blocked due to a touch operation of the user. Therefore, it is suitable that the first area AR1 is located in an edge area in which a user touch is seldom made.

The second area AR2 may include a central area of the display panel 10. The second area AR2 may be an entire area of the display panel 10 other than the first area AR1. The second area AR2 may be an area for fingerprint sensing. In an embodiment, the second area AR2 may be set to an area allowing a user touch to be made, and may be set to a partial area of the display panel 10, or may be set to the entire area of the display panel 10 other than the first area AR1.

A boundary area MGA may be located in the display panel 10 between the first area AR1 and the second area AR2.

FIG. 7 shows an illustrative boundary area MGAa, which is an enlargement of the boundary area MGA between the first area AR1 and the second area AR2.

The pixels PX may be located in the first area AR1 and the second area AR2 and connected to first scan lines GWL[p] to GWL[p+11], and may include light emitting elements R, G, and B. For example, light emitting element R may emit red light, light emitting element G may emit green light, and light emitting element B may emit blue light. The first scan lines GWL[p] to GWL[p+11] may be arranged in the first direction DR1. The first area AR1 may extend in the first direction DR1 to overlap the first scan lines GWL[p] to GWL[p+11]. The first scan lines GWL[p] to GWL[p+11] may extend in the second direction DR2. Here, p is an integer greater than 0. Furthermore, the pixels PX may be connected to data lines DL[q] to DL[q+7]. The data lines DL[q] to DL[q+7] may extend in the first direction DR1 and may be arranged in the second direction DR2. Here, q is an integer greater than 0.

Each of the light emitting elements R, G, and B of the pixels PX may emit one among a first color of light, a second color of light, and a third color of light. The first color, the second color, and the third color may be different colors. For example, the first color may be one of red, green, and blue. The second color may be one of red, green, and blue, other than the first color. The third color may be the remaining color among the red, green, and blue, other than the first color and the second color. Furthermore, in lieu of red, green, and blue, magenta, cyan, and yellow may be used as the first to third colors.

In an embodiment, on the assumption that the light emitting elements R, G, and B of the pixels PX are arranged to have a PENTILE™ structure, there is illustrated a connection relationship of the first scan lines GWL[p] to GWL [p+11], the data lines DL[q] to DL[q+7], and the pixels PX. For example, the pixels PX including the light emitting element R of the first color and the light emitting element B of the third color may be connected in common to the same data line DL[q], DL[q+2], DL[q+4], or DL[q+6]. The pixels PX including the light emitting elements G of the second color may be connected to an independent data line DL[q+1], DL[q+3], DL[q+5], or DL[q+7]. The data lines DL[q], DL[q+2], DL[q+4], and DL[q+6] to which the pixels PX including the light emitting elements R and B of the first color and the third color are connected, and the data lines DL[q+1], DL[q+3], DL[q+5], and DL[q+7] to which the pixels PX including the light emitting elements G of the second color are connected may be alternately arranged.

Further, the pixels PX including the light emitting element R of the first color and the light emitting element B of the third color may be connected in common to the same first scan line GWL[p+1], GWL[p+3], GWL[p+5], GWL[p+7], GWL[p+9], or GWL[p+11]. The pixels PX including the light emitting elements G of the second color may be connected to an independent first scan line GWL[p], GWL [p+2], GWL[p+4], GWL[p+6], GWL[p+8], or GWL[p+10]. The first scan lines GWL[p+1], GWL[p+3], GWL[p+5], GWL[p+7], GWL[p+9], and GWL[p+11] to which the pixels PX including the light emitting element R of the first color and the light emitting element B of the third color are connected, and the first scan lines GWL[p], GWL[p+2], GWL[p+4], GWL[p+6], GWL[p+8], and GWL[p+10] to which the pixels PX including the light emitting elements G of the second color are connected may be alternately arranged.

In an embodiment, the light emitting elements R, G, and B of the pixels PX may be arranged to have another structure such as an RGB stripe structure.

The light sensors FX described with reference to FIGS. 3 and 4 may include first light sensors FX located in the first area AR1 and second light sensors FX located in the second area AR2.

In an embodiment, the first light sensors FX are located in the first area AR1 and connected to the first scan lines GWL[p+1], GWL[p+3], GWL[p+5], GWL[p+7], GWL[p+9], and GWL[p+11], and may include first light receiving elements.

In an embodiment, the second light sensors FX are located in the second area AR2 and connected to the first scan lines GWL[p+1], GWL[p+3], GWL[p+5], GWL[p+7], GWL[p+9], and GWL[p+11], and may include second light receiving elements. For example, the first light sensors FX, the second light sensors FX, the pixels PX including the light emitting elements R of the first color, and the pixels PX including the light emitting elements B of the third color may be connected to the same first scan lines GWL[p+1], GWL[p+3], GWL[p+5], GWL[p+7], GWL[p+9], or GWL[p+11].

In an embodiment, the first light sensors FX and the second light sensors FX are connected to the common reset line RSL (refer to FIG. 1). The first light sensors FX and the second light sensors FX may be connected to the corresponding readout lines ROL[s] to ROL[s+3]. The readout lines ROL[s] to ROL[s+3] may extend in the first direction DR1 and may be arranged in the second direction DR2.

The readout line ROL[s] located in the first area AR1 may be connected to first, second, third, and fourth groups of first light sensors FX. In an embodiment, the first light receiving elements included in the first light sensors FX of the first group overlap a first color filter OR of the first color. In an embodiment, the first light receiving elements included in the first light sensors FX of the second group overlap a second color filter OG of the second color. In an embodiment, the first light receiving elements included in the first light sensors FX of the third group overlap a third color filter OB of the third color. In an embodiment, the first light receiving elements of the fourth group do not overlap a color filter, or may be covered with a transparent material O.

In the present embodiment, the first light sensors FX of the first, second, third, and fourth groups may be successively located in the first direction DR1, and may be connected to the readout line ROL[s]. The same sequence may be repeated in such a way that the first light sensor FX of the first group is located again next to the first light sensor FX of the fourth group in the first direction.

In an embodiment, the readout lines ROL[s+1], ROL[s+2], and ROL[s+3] located in the second area AR2 are connected to the second light sensors FX. In an embodiment, the second light receiving elements of the second light sensors FX do not overlap a color filter, or may be covered with a transparent material O. In an embodiment, the second light receiving elements of the second light sensors FX may overlap a green color filter.

The color filters OR, OG, and OB and the transparent material O may be located in the third direction DR3 from the light receiving elements.

Figure 8:
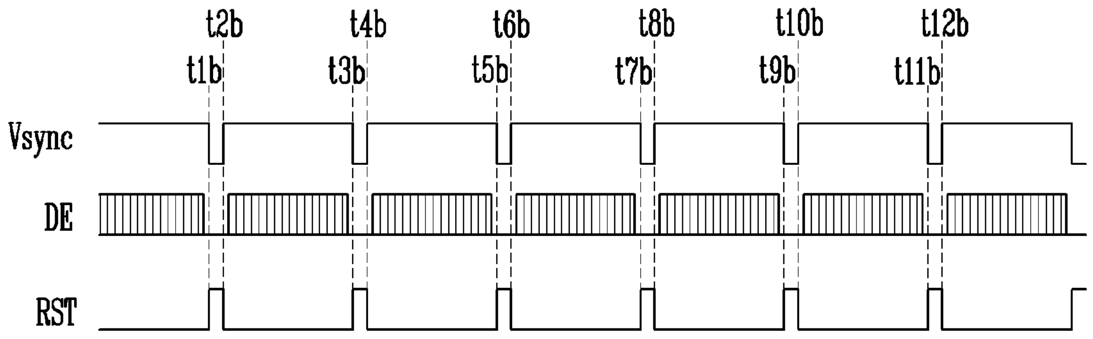
FIG. 8 is a diagram for describing a first mode of the display device.

FIG. 8 is a diagram for describing a first mode MODE1 of the display device DD.

Referring to FIG. 8, there are illustrated a vertical synchronization signal Vsync, a data enable signal DE, and a reset signal RST in the first mode MODE1 during a specific period (e.g., a plurality of frame periods).

Each cycle of the vertical synchronization signal Vsync may correspond to each frame period t1*b* to t3*b*, t3*b* to t5*b*, t5*b* to t7*b*, t7*b* to t9*b*, t9*b* to t11*b*.

The data enable signal DE may include pulses of a plurality of enable levels. In response to pulses of an enable level, grayscale signals may be supplied from the processor to the pixels PX. Therefore, when pulses of the data enable signal DE are generated, synchronized first scan signals may also be sequentially supplied.

During the specific period, in an embodiment of the first mode MODE1, the reset signal RST of a first pattern includes pulses which are repeated in a unit of a frame. For example, the pulses of the reset signal RST of the first pattern may be synchronized with pulses of the vertical synchronization signal Vsync. For example, the pulses of the reset signal RST of the first pattern may overlap the pulses of the vertical synchronization signal Vsync. For example, the reset signal RST may include a pulse for each frame period. For example, during the first mode, the vertical synchronization signal Vsync may include a pulse from period t1*b* to period t2*b*, a pulse from period t3*b* to period t4*b*, a pulse from period t5*b* to period t6*b*, a pulse from period t7*b* to period t8*b*, a pulse from period t9*b* to period t10*b*, and a pulse from period t11*b* to period t12*b*.

In an embodiment, the readout circuit 60 may generate sensing information based on the first light sensors FX of one group during each frame period. For example, the readout circuit 60 may generate sensing information based on the first light sensors FX of the first group during a first frame period from t1*b* to t3*b*. Here, the sensing information may refer to an intensity value of light of the first color among ambient light. Next, the readout circuit 60 may generate sensing information based on the first light sensors FX of the second group during a second frame period from t3*b* to t5*b*. Here, the sensing information may refer to an intensity value of light of the second color among ambient light. Next, the readout circuit 60 may generate sensing information based on the first light sensors FX of the third group during a third frame period from t5*b* to t7*b*. Here, the sensing information may refer to an intensity value of light of the third color among ambient light. Next, the readout circuit 60 may generate sensing information based on the first light sensors FX of the fourth group during a fourth frame period from t7*b* to t9*b*. Here, the sensing information may refer to an intensity value (illuminance information) of ambient light. For example, the sensing information based on the first light sensors FX of the fourth group may be based on light of at least one of the first color, the second color, and the third color, or light of a color different from the first through third colors. Next, the readout circuit 60 may generate sensing information based on the first light sensors FX of the first group during a fifth frame period from t9*b* to t11*b*. Here, the sensing information may refer to an intensity value of light of the first color among ambient light. As such, the readout circuit 60 may repeatedly provide sensing information about the first, second, third, and fourth groups in a unit of a frame.

Here, sensing information about all of the first, second, third, and fourth groups in one frame period may be provided, so long as the performance of an analog-digital converter of the readout circuit 60 can be enhanced, or the number of analog-digital converters can be increased.

In the illuminance sensing operation or the RGB light sensing operation in the first mode MODE1, a separate frame period for the light receiving period EIT is not needed. The reason for this is because of the fact that sensing current required for reading in the first light sensor at an initial stage of the frame period may be relatively low, but sensing current required for reading in the first light sensor at a last stage of the frame period may be sufficiently high. Therefore, the readout circuit 60 may provide gradation-type sensing information in each frame period, and the timing controller 70 or the processor may use the sensing information to detect the illuminance and the concentration of RGB light.

Figure 9:
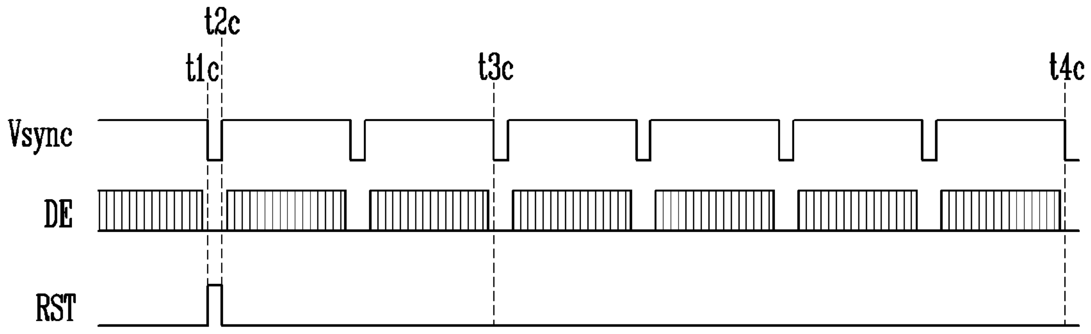
FIG. 9 is a diagram for describing a second mode of the display device.

FIG. 9 is a diagram for describing a second mode MODE2 of the display device DD.

Referring to FIG. 9, there are illustrated a vertical synchronization signal Vsync, a data enable signal DE, and a reset signal RST in the second mode MODE2 during a specific period (e.g., a plurality of frame periods). Here, the term “specific period” may refer to a period defined to compare the cases of FIGS. 8 and 9. In FIGS. 8 and 9, seven frame periods are illustrated as being included in the specific period.

Description of the vertical synchronization signal Vsync and the data enable signal DE is the same as FIG. 8; therefore, redundant explanation thereof will be omitted.

During the specific period, in an embodiment of the second mode MODE2, the reset signal RST of a second pattern includes a single pulse. For the specific period, the number of pulses included in the reset signal RST of the first pattern of FIG. 8 may be greater than the number of pulses included in the reset signal RST of the second pattern of FIG. 9. For example, in an embodiment, the reset signal RST includes more pulses during a given period in the first mode MODE1 than during the given period in the second mode MODE2.

Because the second mode MODE2 is a mode for fingerprint sensing, a sufficient light receiving period EIT is needed to be provided to the second light sensors FX to obtain an accurate fingerprint image. In the case of FIG. 9, the light receiving period EIT may be provided during two frame periods from t1*c* to t3*c* by way of example. During frame periods from t3*c* to t4*c* after the light receiving period EIT, sensing currents of the second light sensors FX are received, so that the readout circuit 60 can generate sensing information for the fingerprint image of the user.

Figure 10:
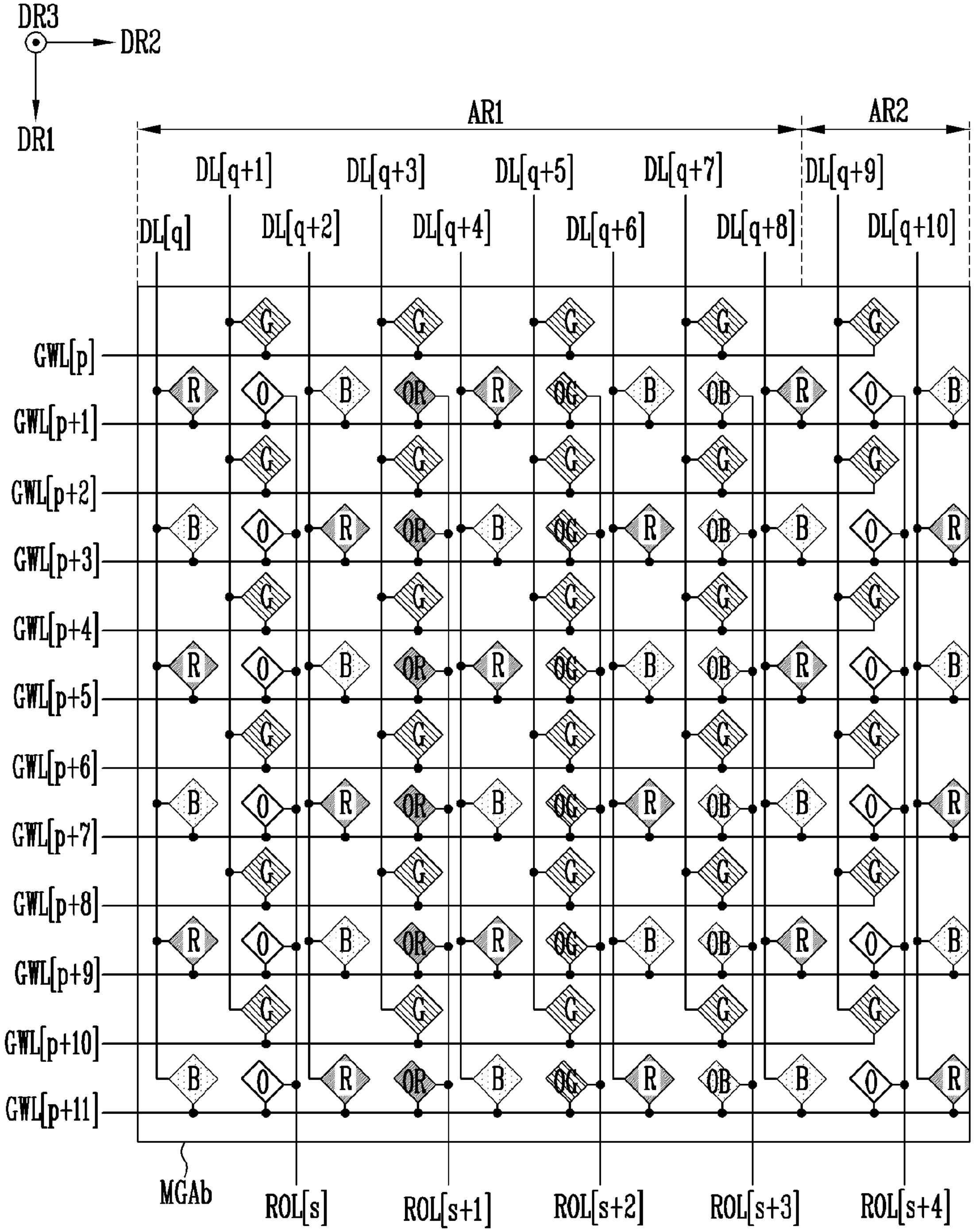
FIG. 10 is a diagram for describing a display panel in accordance with an embodiment of the present disclosure.

FIG. 10 is a diagram for describing a display panel in accordance with an embodiment of the present disclosure.

FIG. 10 shows an illustrative boundary area MGAb, which is an enlargement of the boundary area MGA between the first area AR1 and the second area AR2. Arrangement of the pixels PX of FIG. 10 is the same as that of the pixels PX of FIG. 7; therefore, redundant explanation of the pixels PX will be omitted. Furthermore, in the following description of the light sensors FX of FIG. 10, redundant explanation overlapping that of the light sensors FX of FIG. 7 will be omitted.

In an embodiment, a plurality of readout lines ROL[s], ROL[s+1], ROL[s+2], and ROL[s+3] are located in the first area AR1.

For instance, the first readout line ROL[s+1] may be connected to the first light sensors FX of the first group. The second readout line ROL[s+2] may be connected to the first light sensors FX of the second group. The third readout line ROL[s+3] may be connected to the first light sensors FX of the third group. The fourth readout line ROL[s] may be connected to the first light sensors FX of the fourth group.

Here, the first light receiving elements of the first group may overlap the first color filter OR of the first color. The first light receiving elements of the second group may overlap the second color filter OG of the second color. The first light receiving elements of the third group may overlap the third color filter OB of the third color. In an embodiment, the first light receiving element of the fourth group do not overlap a color filter, or may be covered with a transparent material O.

In the present embodiment, the first light sensors FX of the fourth, first, second, and third groups may be successively located in the second direction DR2. The sequence between the groups may be changed. For example, the first light sensors FX of the first, second, third, and fourth groups may be successively located in the second direction DR2.

The readout circuit 60 may generate sensing information based on the first light sensors FX of the first, second, third, and fourth groups during each frame period. In an embodiment of FIG. 10, because the first light sensors FX of the first, second, third, and fourth groups are connected to the same first scan line, an illuminance sensing operation and an RGB light sensing operation may be simultaneously performed during one frame period.

Figure 11:
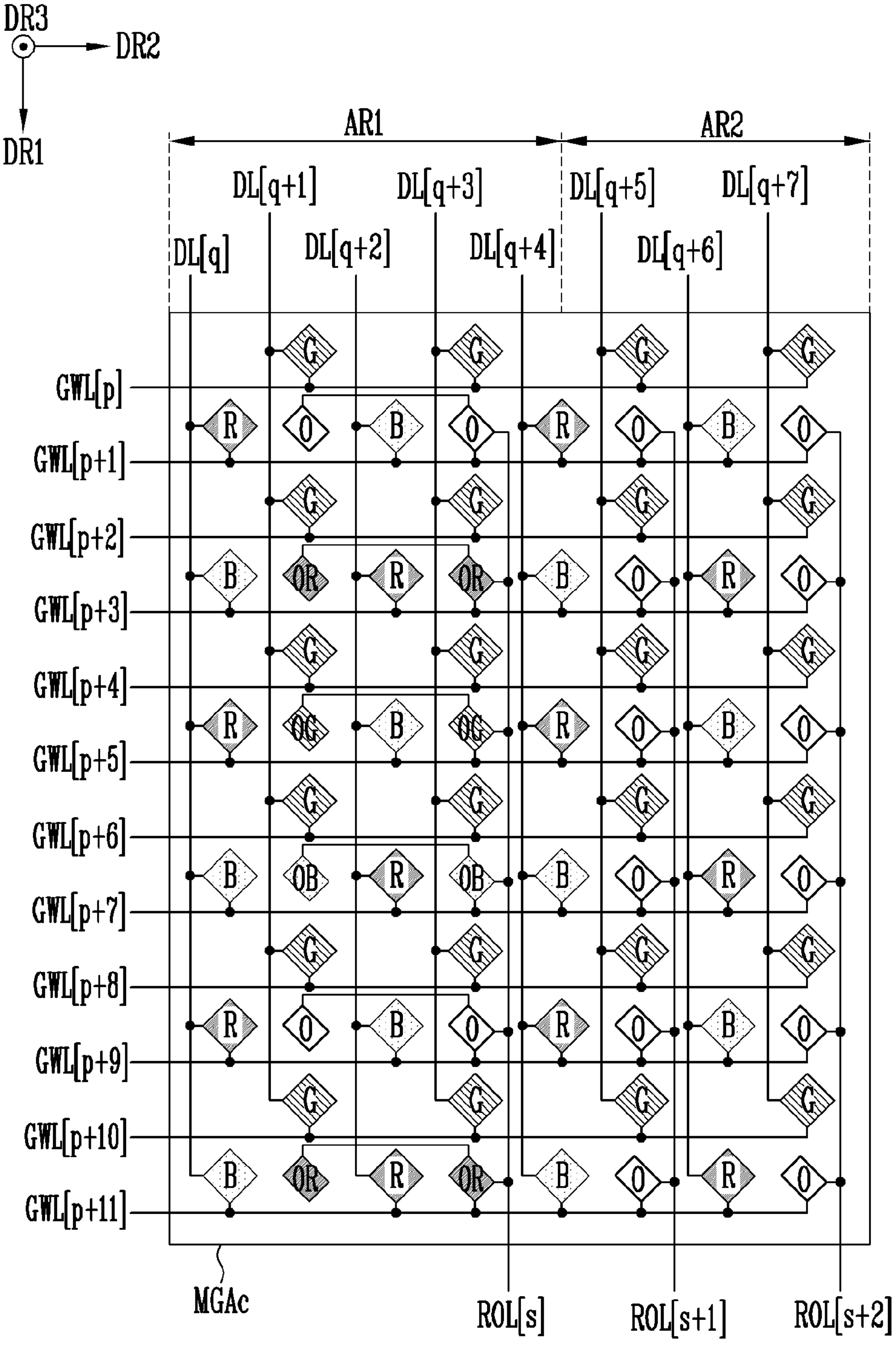
FIG. 11 is a diagram for describing a display panel in accordance with an embodiment of the present disclosure.
Figure 12:
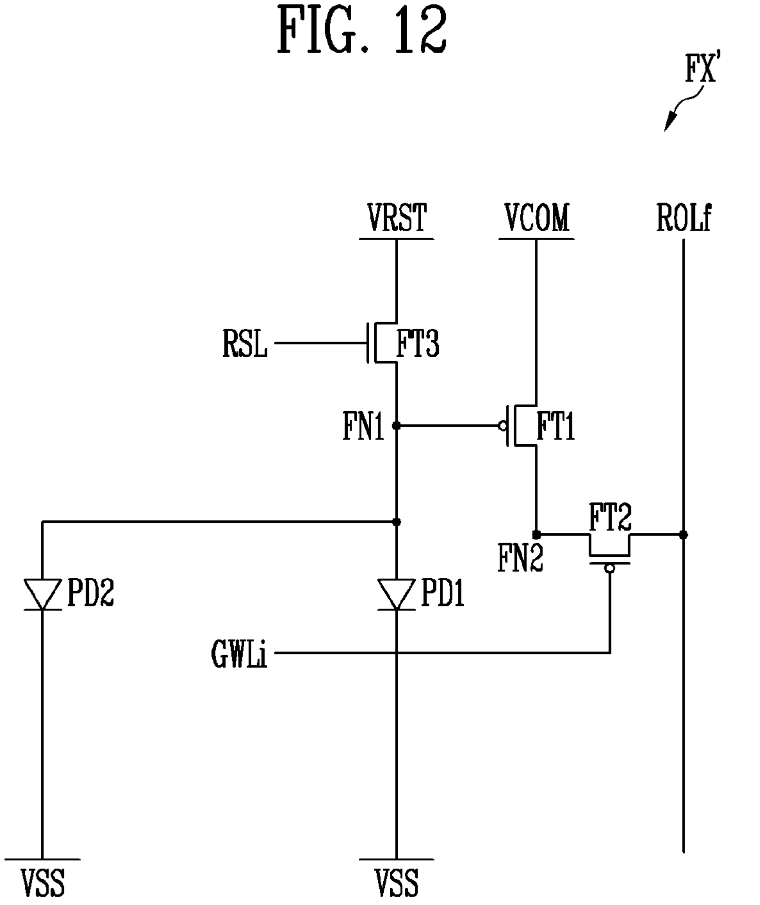
FIG. 12 is a diagram for describing a light sensor in accordance with an embodiment of the present disclosure.

FIG. 11 is a diagram for describing a display panel in accordance with an embodiment of the present disclosure. FIG. 12 is a diagram for describing an optical sensor in accordance with an embodiment of the present disclosure.

FIG. 11 shows an illustrative boundary area MGAc, which is an enlargement of a boundary area MGA between the first area AR1 and the second area AR2.

Connection of first light sensors FX' of FIG. 11 to the readout line ROL[s] and the first scan lines GWL[p+1], GWL[p+3], GWL[p+5], GWL[p+7], GWL[p+9], and GWL [p+11] is the same as that of the case of FIG. 7. However, the case of FIG. 11 is different from the case of FIG. 7 in that each of the first light sensors FX' includes a plurality of first light receiving elements to increase a light receiving rate.

For example, referring to FIG. 12, the first light sensor FX' includes a plurality of first light receiving elements PD1 and PD2. The plurality of light receiving elements PD1 and PD2 may be connected in parallel between the first node FN1 and the second power line (e.g., receiving VSS). Here, a color filter of the same color may overlap the plurality of first light receiving elements PD1 and PD2. In an embodiment, the plurality of first light receiving elements PD1 and PD2 included in the light sensor FX' for illuminance sensing do not overlap the color filter, or may be covered with a transparent material O.

In an embodiment, each of the second light sensors FX in the second area AR2 of FIG. 11 include only one light receiving element in the same manner as the case of FIG. 7 to maintain the resolution of a fingerprint image.

Figure 13:
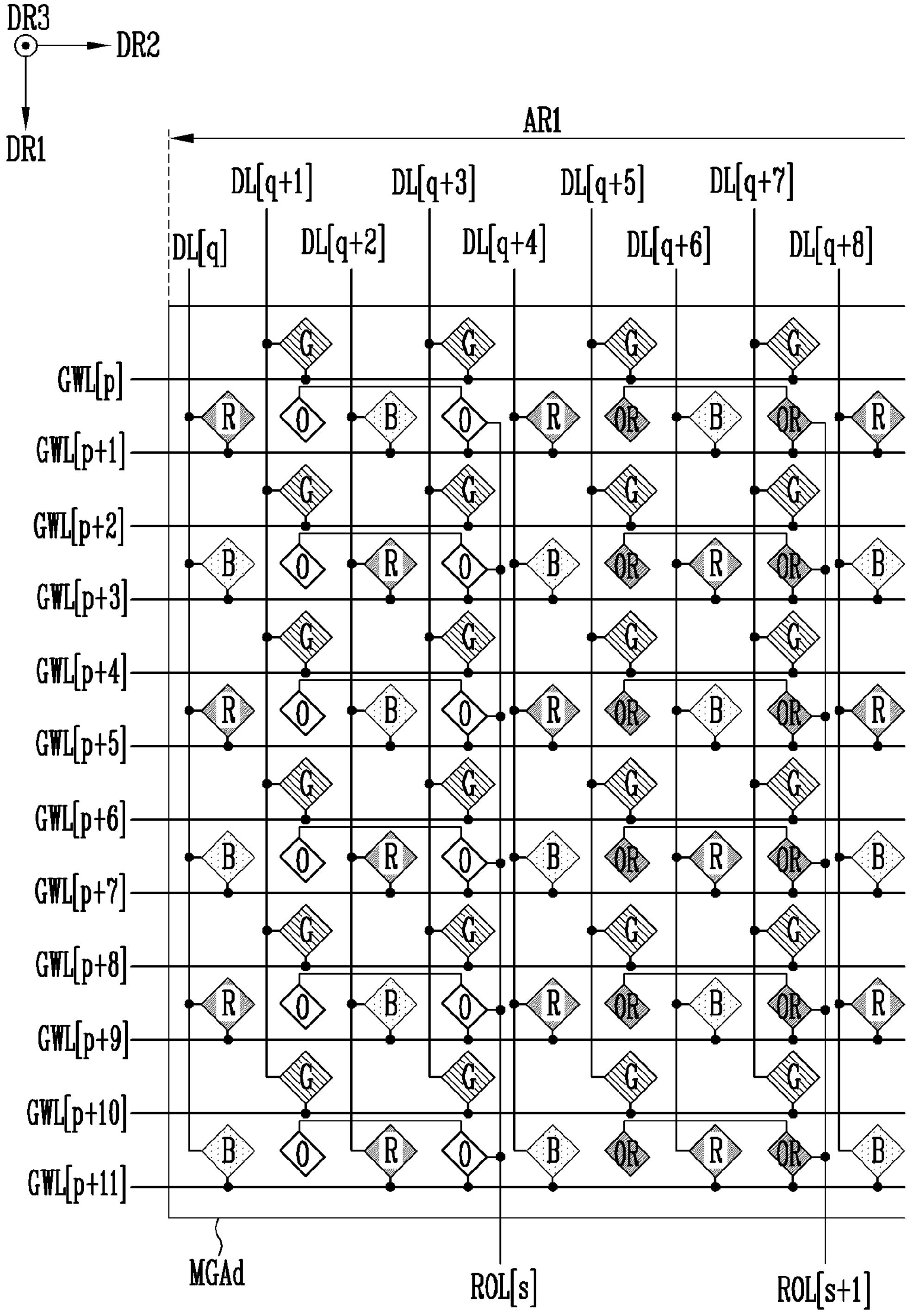
FIG. 13 is a diagram for describing a display panel in accordance with an embodiment of the present disclosure.

FIG. 13 is a diagram for describing a display panel in accordance with an embodiment of the present disclosure.

FIG. 13 shows an illustrative boundary area MGAd, which is an enlargement of a boundary area MGA between the first area AR1 and the second area AR2. Here, with the limitations of expression, only a portion of the first area AR1 is illustrated in FIG. 13. For example, the second area AR2 may also be present.

Connection of first light sensors FX' of each group of FIG. 13 to the corresponding readout lines ROL[s] and ROL[s+1] and the first scan lines GWL[p+1], GWL[p+3], GWL[p+5], GWL[p+7], GWL[p+9], and GWL[p+11] is the same as that of the case of FIG. 10. However, the case of FIG. 13 is different from the case of FIG. 10 in that each of the first light sensors FX' includes a plurality of first light receiving elements to increase a light receiving rate.

In an embodiment, each of the second light sensors FX in the second area AR2 associated with FIG. 13 include only one light receiving element in the same manner as the case of FIG. 10 to maintain the resolution of a fingerprint image.

In a display device and a method of driving the display device in accordance with the present disclosure, an illuminance sensor, an RGB light sensor, and a fingerprint sensor are designed to have substantially the same configuration, and are connected through the same control line.

Although embodiments of the present disclosure have been disclosed for illustrative purposes, those skilled in the art will appreciate that various modifications, additions and substitutions are possible, without departing from the scope and spirit of the present disclosure as disclosed in the accompanying claims.

What is claimed is:

1. A display device, comprising:

a reset circuit configured to apply a reset signal to a reset line; and a display panel including a first area located adjacent to an edge of the display panel, and a second area located adjacent to the first area, the display panel comprising:

a plurality of pixels located in the first area and the second area, connected to scan lines, and including light emitting elements;

a plurality of first light sensors located in the first area, connected to the scan lines, and including first light receiving elements; and a plurality of second light sensors located in the second area, connected to the scan lines, and including second light receiving elements, wherein the first light sensors and the second light sensors are connected to the reset line in common, wherein the reset circuit sets the reset signal to include a first pattern in a first mode in which sensing information is generated based on the first light sensors, and wherein the reset circuit sets the reset signal to include a second pattern in a second mode in which sensing information is generated based on the second light sensors.

2. The display device according to claim 1, wherein a number of pulses included in the first pattern during a specific period is greater than a number of pulses included in the second pattern during the specific period.

3. The display device according to claim 2, wherein the first pattern includes a pulse that repeats each frame period, wherein, during the specific period, the second pattern includes a single pulse.

4. The display device according to claim 1, wherein the scan lines are arranged in a first direction, and wherein the first area extends in the first direction to overlap the scan lines.

5. The display device according to claim 4, wherein the display panel further comprises a readout line located in the first area, wherein the readout line is connected to the first light sensors of a first group, a second group, and a third group, wherein the first light receiving elements of the first group overlap a first color filter of a first color, wherein the first light receiving elements of the second group overlap a second color filter of a second color, and wherein the first light receiving elements of the third group overlap a third color filter of a third color.

6. The display device according to claim 5, wherein the readout line is further connected to the first light sensors of a fourth group, and wherein the first light receiving elements of the fourth group do not overlap a color filter.

7. The display device according to claim 6, further comprising a readout circuit connected with the readout line, wherein the readout circuit generates the sensing information based on the first light sensors of one group among the first group, the second group, the third group, and the fourth group during one frame period.

8. The display device according to claim 4, wherein the display panel further comprises a first readout line, a second readout line, and a third readout line that are located in the first area, wherein the first readout line is connected to the first light sensors of a first group, wherein the second readout line is connected to the first light sensors of a second group, wherein the third readout line is connected to the first light sensors of a third group, wherein the first light receiving elements of the first group overlap a first color filter of a first color, wherein the first light receiving elements of the second group overlap a second color filter of a second color, and wherein the first light receiving elements of the third group overlap a third color filter of a third color.

9. The display device according to claim 8, wherein the display panel further comprises a fourth readout line located in the first area, wherein the fourth readout line is connected to the first light sensors of a fourth group, and wherein the first light receiving elements of the fourth group do not overlap a color filter.

10. The display device according to claim 9, further comprising a readout circuit connected to the first readout line, the second readout line, the third readout line, and the fourth readout line, wherein the readout circuit generates the sensing information based on the first light sensors of the first group, the second group, the third group, and the fourth group during one frame period.

11. A method of driving a display device, comprising:

supplying a reset signal in common to both first light sensors located in a first area of a display panel and to second light sensors located in a second area of the display panel, the first light sensors including first light receiving elements and the second light sensors including second light sensors;

supplying scan signals to the first light sensors, the second light sensors, and pixels located in the first area and the second area; and generating sensing information based on the first light sensors when current mode is set to a first mode, and otherwise generating sensing information based on the second light sensors when the current mode is set to a second mode, and wherein the reset signal includes a first pattern in the first mode and a second pattern in the second mode.

12. The method according to claim 11, wherein a number of pulses included in the first pattern during a specific period is greater than a number of pulses included in the second pattern during the specific period.

13. The method according to claim 12, wherein the first pattern includes a pulse that repeats each frame period, and wherein, during the specific period, the second pattern includes a single pulse.

14. The method according to claim 11, wherein the display panel includes scan lines, wherein the scan lines are arranged in a first direction, and wherein the first area extends in the first direction to overlap the scan lines.

15. The method according to claim 14, wherein the display panel further comprises a readout line located in the first area, wherein the readout line is connected to the first light sensors of a first group, a second group, and a third group, wherein the first light receiving elements of the first group overlap a first color filter of a first color, wherein the first light receiving elements of the second group overlap a second color filter of a second color, and wherein the first light receiving elements of the third group overlap a third color filter of a third color.

16. The method according to claim 15, wherein the readout line is further connected to the first light sensors of a fourth group, and wherein the first light receiving elements of the fourth group do not overlap a color filter.

17. The method according to claim 16, wherein the display device further comprises a readout circuit connected with the readout line, and wherein the readout circuit generates the sensing information based on the first light sensors of one group among the first group, the second group, the third group, and the fourth group during one frame period.

18. The method according to claim 14, wherein the display panel further comprises a first readout line, a second readout line, and a third readout line that are located in the first area, wherein the first readout line is connected to the first light sensors of a first group, wherein the second readout line is connected to the first light sensors of a second group, wherein the third readout line is connected to the first light sensors of a third group, wherein the first light receiving elements of the first group overlaps a first color filter of a first color, wherein the first light receiving elements of the second group overlaps a second color filter of a second color, and wherein the first light receiving elements of the third group overlaps a third color filter of a third color.

19. The method according to claim 18, wherein the display panel further comprises a fourth readout line located in the first area, wherein the fourth readout line is connected to the first light sensors of a fourth group, wherein the first light receiving elements of the fourth group do not overlap a color filter, wherein the display device further comprises a readout circuit connected to the first readout line, the second readout line, the third readout line, and the fourth readout line, and wherein the readout circuit generates the sensing information based on the first light sensors of the first group, the second group, the third group, and the fourth group during one frame period.

20. An electronic device, comprising:

a processor configured to provide image signals and timing signals; and a display device configured to display images based on the image signals and the timing signals, wherein the display device comprises:

a reset circuit configured to apply a reset signal to a reset line; and a display panel including a first area located adjacent to an edge of the display panel, and a second area located adjacent to the first area, the display panel comprising:

a plurality of pixels located in the first area and the second area, connected to scan lines, and including light emitting elements;

a plurality of first light sensors located in the first area, connected to the scan lines, and including first light receiving elements; and a plurality of second light sensors located in the second area, connected to the scan lines, and including second light receiving elements, wherein the first light sensors and the second light sensors are connected to the reset line in common, wherein the reset circuit sets the reset signal to include a first pattern in a first mode in which sensing information is generated based on the first light sensors, and wherein the reset circuit sets the reset signal to include a second pattern in a second mode in which sensing information is generated based on the second light sensors.

* * * * *